(12) United States Patent
Treur et al.

(10) Patent No.: US 7,170,190 B1
(45) Date of Patent: Jan. 30, 2007

(54) APPARATUS FOR OSCILLATING A HEAD AND METHODS FOR IMPLEMENTING THE SAME

(75) Inventors: Randolph E. Treur, San Luis Obispo, CA (US); John M. Boyd, Atascadero, CA (US); Tom Anderson, Livermore, CA (US); John de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/738,164

(22) Filed: Dec. 16, 2003

(51) Int. Cl.
*H01L 23/58* (2006.01)
*B08B 6/00* (2006.01)
*C25F 1/00* (2006.01)

(52) U.S. Cl. .................. 257/798; 451/106; 134/1.2

(58) Field of Classification Search .............. 451/119, 451/121, 111, 108, 82, 67, 106; 134/187, 134/1.2, 1.3; 257/798
See application file for complete search history.

(56) References Cited

U.S. PATENT DOCUMENTS

| | | | |
|---|---|---|---|
| 4,838,289 A | 6/1989 | Kottman et al. | |
| 5,271,774 A | 12/1993 | Leenaars et al. | |
| 5,660,642 A | 8/1997 | Britten | |
| 5,705,223 A | 1/1998 | Bunkofske | |
| 5,882,433 A | 3/1999 | Ueno | |
| 5,945,351 A | 8/1999 | Mathuni | |
| 5,975,094 A * | 11/1999 | Shurtliff ..................... | 134/1.3 |
| 5,997,653 A | 12/1999 | Yamasaka | |
| 6,149,505 A * | 11/2000 | Brown et al. ................. | 451/56 |
| 6,152,813 A * | 11/2000 | Suzuki ....................... | 451/443 |
| 6,398,975 B1 | 6/2002 | Mertens et al. | |
| 6,449,792 B1 * | 9/2002 | Myers ......................... | 15/28 |
| 6,491,764 B2 | 12/2002 | Mertens et al. | |
| 6,810,548 B2 * | 11/2004 | Yoshioka et al. ............. | 15/77 |
| 6,866,051 B1 * | 3/2005 | Nickhou et al. ............ | 134/200 |
| 6,951,042 B1 * | 10/2005 | Mikhaylichenko et al. .... | 15/77 |
| 2002/0121290 A1 | 9/2002 | Tang et al. | |
| 2002/0125212 A1 | 9/2002 | Mertens et al. | |
| 2002/0139393 A1 * | 10/2002 | Crevasse et al. ............. | 134/6 |
| 2003/0190874 A1 * | 10/2003 | So .............................. | 451/56 |

FOREIGN PATENT DOCUMENTS

| | | |
|---|---|---|
| EP | 0 905 746 A1 | 3/1999 |
| EP | 0 905 747 A1 | 3/1999 |
| JP | 02280330 | 11/1990 |
| JP | 02309638 | 12/1990 |
| JP | 11350169 | 12/1999 |
| WO | WO 99/16109 | 4/1999 |
| WO | WO 02/32825 A1 | 4/2002 |
| WO | WO 02/101795 A2 | 12/2002 |
| WO | WO 02/101795 A3 | 12/2002 |

OTHER PUBLICATIONS

Britten, "*A moving-zone Marangoni drying process for critical cleaning and wet processing*", pp. 143-148, Oct. 1997, Solid State Technology.

* cited by examiner

*Primary Examiner*—W. David Coleman
(74) *Attorney, Agent, or Firm*—Martine Penilla & Gencarella, LLP

(57) ABSTRACT

An apparatus for brushing a surface of a substrate is provided. The apparatus includes a brush for scrubbing the surface of the substrate, a head for holding the brush, and an arm. The arm is configured to hold the head about a connection point. The arm is connected to an oscillating mechanism configured to cause the head to oscillate at an angle of rotation about the connection point.

17 Claims, 13 Drawing Sheets

APPARATUS FOR OSCILLATING A HEAD AND METHODS FOR IMPLEMENTING THE SAME

BACKGROUND OF THE INVENTION

1. Field of the Invention

The present invention relates generally to the fabrication of semiconductor devices and, more particularly, to cleaning semiconductor substrates.

2. Description of the Related Art

The fabrication of semiconductor devices involves numerous processing operations. These operations include, for example, impurity implants, gate oxide generation, inter-metal oxide depositions, metallization depositions, photolithography patterning, etching operations, chemical mechanical polishing (CMP), etc. As these operations generate particles and residues, wafer surfaces need to be cleaned so as to remove particulate contaminants adhered to the surfaces of the wafer.

Particulate contaminants generally consist of tiny bits of distinctly defined material having an affinity to adhere to the surface of the wafer. Examples of particulate contaminants can include organic and inorganic residues, such as silicon dust, silica, slurry residue, polymeric residue, metal flakes, atmospheric dust, plastic particles, and silicate particles, among others. Particulate contaminants should be removed from wafer surfaces as the existence of such contaminants can have a detrimental effect on the performance of the integrated circuit devices.

Cleaning the front side (i.e., the active side or top surface) of wafers has traditionally been given a higher priority in typical wafer cleaning systems and processes because particulate contaminants adhered to the active side of a wafer can cause deleterious defects in the processing of the wafer. However, as wafer sizes have increased and/or feature sizes have decreased, certain shortcomings have been associated with the failure to adequately and properly clean and process the backside (i.e., non-active side) of wafers.

One exemplary shortcoming is the focal plane deviation phenomenon associated with reduction of depth of fields for photolithography equipments. Namely, particulate contaminants having a size ranging between about 0.5 microns and about 10 microns adhered to the wafer backside can form high and low points throughout the wafer surface. As a result, the wafer surface is (locally) tilted or distorted, thus creating a focal plane deviation. Although such deviation can be very slight, nonetheless, a number of challenges surface during photolithographic processes designed to form very small features.

In addition to creating focal plane deviation, contaminant particulates having a size ranging between about 90 nm to 0.5 micron have proven to migrate from a wafer backside to the wafer front side. For example, the migration may occur during a wet processing step and/or as the wafer is moved or otherwise handled between the processing or metrology tools. Furthermore, the backside contaminants can undesirably migrate from one process tool/step thus contaminating subsequent processes.

To eliminate such drawbacks, backside of wafers can be cleaned using a rotary type cleaning assembly or a roller type cleaning assembly. In a rotary type cleaning assembly, a wafer backside is cleaned as a brush is applied onto the wafer backside is being rotated in a specific direction. In a roller type cleaning assembly, a top brush and a bottom brush are brought into contract with the wafer front side and backside as the top brush and the bottom brush are being rotated in respective rotation directions. In either scenario, fluid is supplied onto the cleaning interface either externally or through the rotary or roller type brushes.

Unfortunately, processing the front and backside of the wafer using the roller type and rotary type brushes can have certain disadvantages. For instance, as a rotary brush rotates so as to clean and process the wafer surface, the rotary movement of the brush causes the fluid introduced into the cleaning interface to be expelled (e.g., flinging droplets) onto the portions of the wafer surface not covered by the rotary brush as well as around the inner wall of the cleaning module chamber.

With respect to roller type brushes, fluid defined at the edge of the wafer can migrate to the opposite surface of the wafer as the rollers rotate, contaminating the otherwise cleaned surface. The fluid migration phenomenon particularly hinders processing of a wafer wherein divergent process chemistries should be implemented. By way of example, as semiconductor devices only reside on the front side of the wafer, cleaning the wafer backside can be enhanced by using a more aggressive chemistry. However, due to fluid migration phenomenon, cleaning wafer surface by using truly divergent chemistries may not be achieved.

Irrespective of the brush type, expelled or migrated fluid droplets can contaminate the otherwise clean wafer surfaces, thus decreasing the quality of the cleaning operation. Furthermore, fluid droplets can be expelled onto and around the cleaning chamber, reducing the reliability of the cleaning environment. Still further, fluid migration can damage semiconductor devices on the wafer front side generating faulty wafers, thus reducing throughput.

In view of the foregoing, there is a need for a system and method for cleaning a substrate surface capable of improving the reliability and efficiency of the cleaning operations.

SUMMARY OF THE INVENTION

Broadly speaking, the present invention fills these needs by providing an apparatus and methodology capable of enhancing the reliability as well as efficiency of cleaning operations. In one embodiment, a wafer surface is cleaned as a brush secured to a head is applied onto the wafer surface while the head oscillates at a set frequency. In one example, the head is configured to move across the wafer surface while oscillating at the set frequency. It should be appreciated that the present invention can be implemented in numerous ways, including as a process, an apparatus, a system, a device, or a method. Several inventive embodiments of the present invention are described below.

In one embodiment, an apparatus for brushing a surface of a substrate is provided. The apparatus includes a brush for scrubbing the surface of the substrate, a head for holding the brush, and an arm. The arm is configured to hold the head about a connection point. The arm is connected to an oscillating mechanism configured to cause the head to oscillate at an angle of rotation about the connection point.

In another embodiment, a method for processing a wafer surface is provided. The method includes applying oscillation energy to a flat brush having a brush surface and applying a fluid onto one of the wafer surface and the flat brush. The method further includes applying the brush surface onto the wafer surface while continuing the application of oscillation energy to the flat brush.

In yet another embodiment, still another apparatus for brushing a surface of a substrate is provided. The apparatus includes a brush, a head, and an arm. The brush is configured to scrub the surface of the substrate. The brush is configured to be compressed and decompressed. The head is configured to hold the brush. The arm is configured to hold the head about a connection point. The arm is connected to an oscillating mechanism for causing the head to oscillate at an angle of rotation about the connection point.

In still another embodiment, a brush system for scrubbing a surface of a wafer is provided. The system includes a flat brush, a head, an arm, and an oscillating assembly. The flat brush is configured to be applied to the surface of the wafer and the head is configured to hold the flat brush. The arm is configured to hold the flat brush at a center point of the head. The oscillating assembly has a secondary arm that is connected to the head at a location other than the center point of the head. The oscillating assembly is configured to impart an oscillating frequency to the secondary arm so as to cause the head and flat brush to oscillate when the flat brush is applied to the surface of the wafer.

The advantages of the present invention are numerous. Most notably, in contrast to the prior art wherein the head merely rotates in a single direction, the head of the present invention can move backward and forward in a set frequency while the head is moved across the wafer surface. In this manner, the fluid migration phenomenon and expelling of fluid droplets can be substantially eliminated by confining fluid at the interfacing area of the brush and the wafer surface. Another advantage of the present invention is that the oscillatory movement of the head generates an alternating pressure field (i.e., a pumping action) that is believed to enhance the efficiency of the cleaning operation by improving the local mass transport of fluid and chemistry under the brush. Yet another advantage of the present invention is that by substantially eliminating fluid migration between wafer sides as well as reducing flinging of fluid, the reliability of wafer processing operations can be improved. Still another advantage of the present invention is that in contrast to the mechanisms of rotary type and roller type brushes, the oscillating assembly of the present invention is mechanically less complex and less expensive. Yet another advantage of the present invention is that the mechanical pieces implemented in the oscillating assembly of the present invention are chemically more compatible. Still another advantage of the present invention is that substantially all components of the oscillating assembly are sealed resulting in a cleaner wafer surface. Yet another advantage of the present invention is that the amount of mechanical energy needed to remove a particle contaminant is reduced. Still another advantage of the present invention is that the head cleaning assembly of the present invention implements simplified mechanical motions. Yet another advantage is that the embodiments of the present invention provide improved process control factors (e.g., down force, fluid temperature, oscillation frequency, fluid flow rate, etc.).

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A-2 is a simplified top view mechanism of a magnetic solenoid head, in accordance with still another embodiment of the present invention.

FIG. 2B-1 is a simplified top view of a head being moved back and froth by a solenoid, in accordance with still another embodiment of the present invention.

FIG. 2B-2 is a simplified cross sectional view of the head shown in FIG. 2B-1, in accordance with still another embodiment of the present invention.

FIG. 3A-1 is a simplified top view of an exemplary megasonic oscillating assembly, in accordance with still another embodiment of the present invention.

FIG. 3A-2 is a simplified cross sectional view of the oscillating assembly shown in FIG. 3A-1, in accordance with still another embodiment of the present invention.

FIG. 3B-1 is a simplified top view of an exemplary megasonic oscillating assembly, in accordance with still another embodiment of the present invention.

FIG. 3B-2 is a simplified, partial, isometric view of an exemplary megasonic oscillating assembly, in accordance with still another embodiment of the present invention.

FIG. 3B-3 is a simplified cross-sectional view A—A shown in FIG. 3B, in accordance with still another embodiment of the present invention.

DETAILED DESCRIPTION OF THE PREFERRED EMBODIMENTS

An invention capable of substantially reducing the fluid migration phenomenon and expelling of fluid droplets while enhancing efficiency and reliability of a cleaning operation is provided. In one embodiment, a wafer surface is cleaned as a brush secured to a head is applied onto the wafer surface while the head oscillates at a set frequency. In one embodiment, the backward and forward movements of the head creates an alternating pressure field on the wafer surface that is believed to improve the local mass transport of fluid under the brush thus enhancing the dislodging of particulate contaminants from wafer surfaces. The head can be made to oscillate by a mechanical actuator, a solenoid, or megasonic transducers. In one example, the head is designed to move across the wafer in any desired path. In one instance, the head can be moved across the wafer radially.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As used herein, "oscillation" refers to moving in a first direction for a specific amplitude and then switching direction from the first direction to a second direction, and continuing moving in the second direction for a specific amplitude, and vice versa. The rate at which the directions change dictates the frequency of the oscillation. Furthermore, as used herein "pumping action" refers to a generation of alternating pressure field by the oscillation of the head, which in turn causes the fluid defined on the substrate surfaces to move back and forth. Specifically, rotating the brush in the first direction for the specific amplitude compresses the brush. However, as the brush moves backward in the second direction for the specific amplitude, the brush is decompressed causing the fluid defined between the brush and the wafer surface to move forward and backward.

Figure 1A:
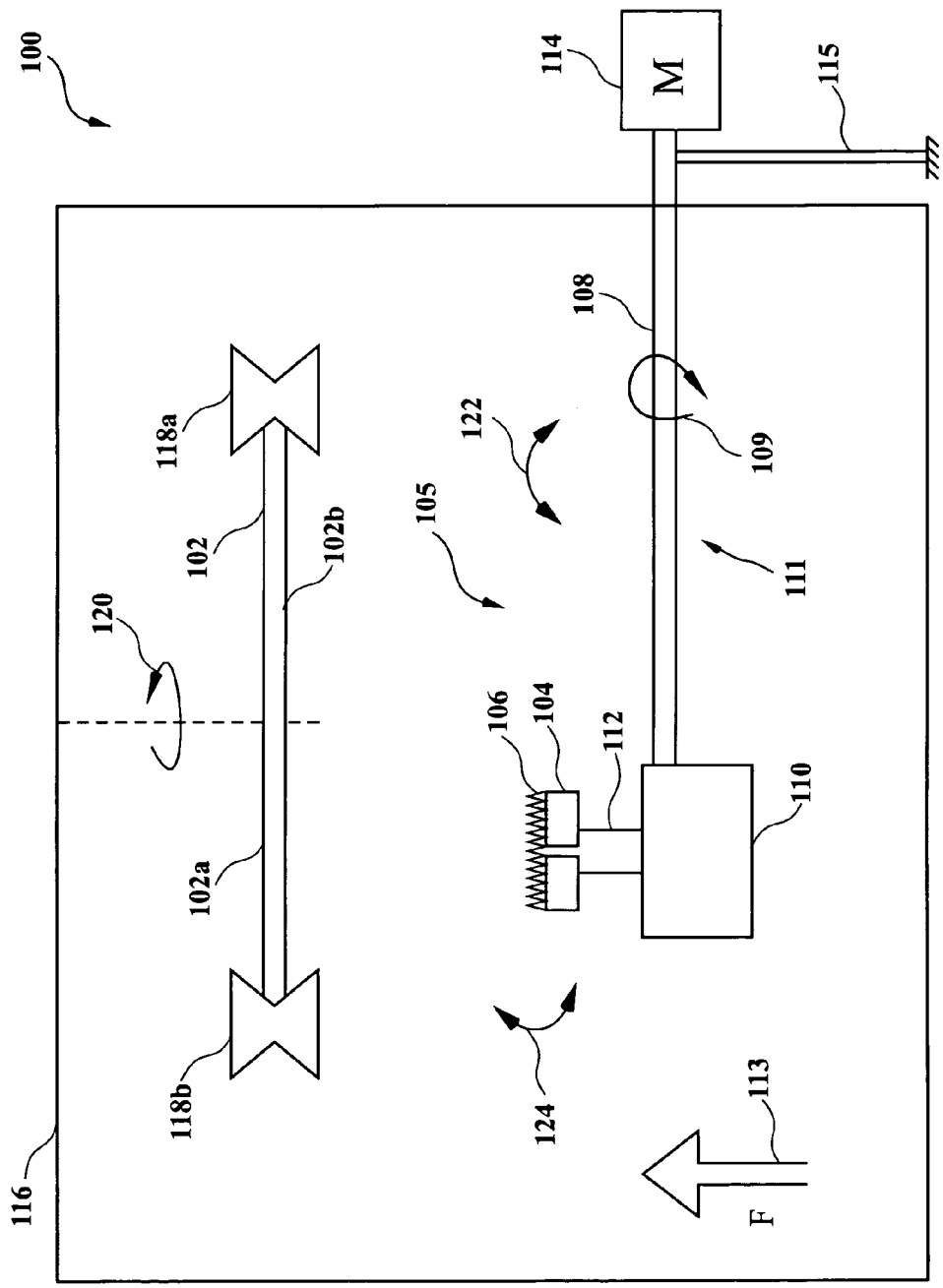
FIG. 1A is a simplified cross-sectional view of an exemplary brush scrubbing module, in accordance with one embodiment of the present invention.

FIG. 1A is a simplified cross-sectional view of an exemplary scrubbing module 100, in accordance with one embodiment of the present invention. As shown, the scrubbing module 100 includes a head assembly 105 and a plurality of rollers 118a–118c, as defined in a housing 116. In the illustrated embodiment, an actuating component 114 is shown to be in contact with the head assembly 105 using an arm 108. As will be explained in more detail below, the actuating component 114 is configured to drive the head assembly 105 during the cleaning operations. In one example, the actuating component 114 is a motor.

The head assembly 105 includes an arm assembly 111, a head 104, and a brush 106. As can be seen, the arm assembly 111 includes the arm 108, the linkage 110, and the connector 112. The arm 108 is shown to be connected to the linkage 110, which in turn, is connected to the connector 112. In one embodiment, the arm 108 is driven by the actuating component 114 and is configured to rotate in a rotation direction 109. As the arm 108 rotates, the linkage 110 translates the rotational movement of the arm 108 into the linear movement of the connector 112, thus causing the head 104 to move backward and forward. That is, the linkage 110 offsets the connector 112, causing the connector 112 to go back and forth and to translate such back and forth movement to the head 104.

In one exemplary embodiment, the linkage 110 is a cam gear. However, one of ordinary skill in the art should appreciate that the linkage 110 can be any component capable of translating the rotational movement of the arm 108 into the linear movement of the connector 112 (e.g., four-bar slider type mechanism, Epicyclic type mechanism, cam-worm type mechanism, etc.). Additionally, the linkage 110 can be defined anywhere so long as the function of creating the oscillating movement can be achieved. Furthermore, although in one example the actuating component 114 is a motor, in a different example, the actuating component 114 can be any component capable of driving the arm 108 and the head assembly 105. Of course, it must be appreciated by one of ordinary skill in the art that different mechanics and engineering can be implemented to cause the head 104 move backward and forward in the oscillation direction 124.

Still referring to FIG. 1A, the wafer 102 is shown to be engaged by two engaging rollers 118a and 118b and a driving roller 118c (not shown in this Figure). In one example, the engaging rollers 118a and 118b are configured to support the wafer 102 and act as stators while the driving roller 118c is configured to rotate the wafer 102 in a rotation direction 120. As can be seen, the arm 108 moves across the wafer backside 102b so as to clean the wafer backside 102b about a vertical axis 115 defined at the fixed end of the arm 108.

According to one implementation, during the cleaning operation, the head 104 and thus the brush 106 are applied onto the wafer backside 102b by a force 113. During application, the head 104 oscillates in the oscillation direction 124 while the arm 108 moves across the wafer backside 102b in the direction 122. In one exemplary embodiment, the force 113 can range between approximately 0 lbs and about 20 lbs. As such, the friction between the brush 106 and the wafer backside 102b is configured to facilitate dislodging of particulate contaminants.

When the head 104 is oscillating, an alternating pressure field can be generated on the wafer backside 102b. In one embodiment, it is believed that particulate contaminants are dislodged and removed from the wafer backside 102b as a result of the local mass transport of fluid under the brush caused by the pumping action. In one instance, a cleaning fluid is also provided onto the cleaning interface through a center of the head 104 and the brush 106.

In one embodiment, a complete angle of rotation of the head 104 is configured to be between about 0 degree and about 180 degrees about the point of connection of the arm 108 and the head 104. That is, a forward angle of rotation and a backward angle of rotation are configured to be half of the complete angle of rotation about a center of rotation (i.e., between about 0 degree and about 90 degrees). Furthermore, the frequency of oscillation can be recipe controlled and can vary depending on the embodiment, between about 0 Hz and about megasonic frequency range.

In one embodiment, the brush 106 is a polyvinyl alcohol (PVA) brush (i.e., a very soft sponge), which can dislodge particulate contaminants using the cleaning fluid. In must be noted, however, that in another example, the brush 106 can be constructed from any suitable material so long as the material can dislodge particulate contaminants from wafer backside 102b (e.g., Politex, polyurethane compounds (e.g., IC1000 (Rodel) polishing pads, etc.), etc.).

One of ordinary skill in the art must further appreciate that the head cleaning assembly 100 of the present invention can be implemented to clean either the front side or the backside of the wafer 102. Additionally, although in the embodiments of the present invention the head cleaning assembly 100 of the present invention is shown to have been defined below the wafer backside 102b, it must be noted that the head cleaning assembly 100 of the present invention can be defined in any configuration with respect to the wafer surface being cleaned so long as the wafer surface to be cleaned faces the brush secured to the head 104.

Figure 1B:
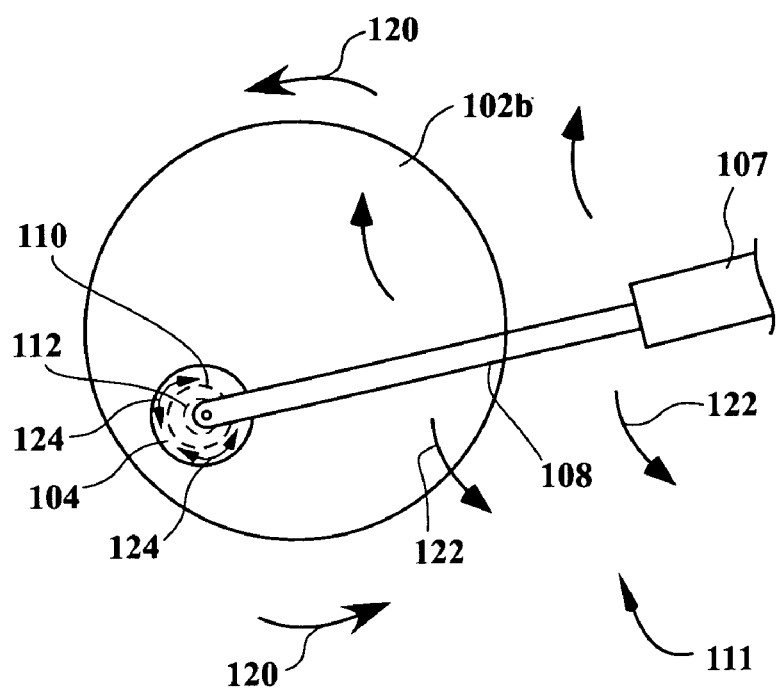
FIG. 1B is a simplified partial top view of an exemplary arm assembly, in accordance with another embodiment of the present invention.

Reference is made to a simplified partial top view diagram of an exemplary arm 108 shown in FIG. 1B, in accordance with one embodiment of the present invention. As can be seen, during the cleaning operation, the wafer 102 is shown to be rotating in the rotation direction 120. The arm 108 as supported by an arm support 107 is being moved radially in the direction 122 across the wafer backside 102b while the head 104 is caused to oscillate in the oscillation direction 124. It must be noted that although in the embodiment shown in FIG. 1B the process arm 108 is shown to be moving radially, in another implementation, the arm 108 can be configured to moved over the wafer backside taking any path. In another example, the arm 108 can be configured to also oscillate during the cleaning operation as the head 104 is being oscillated.

Figure 1C:
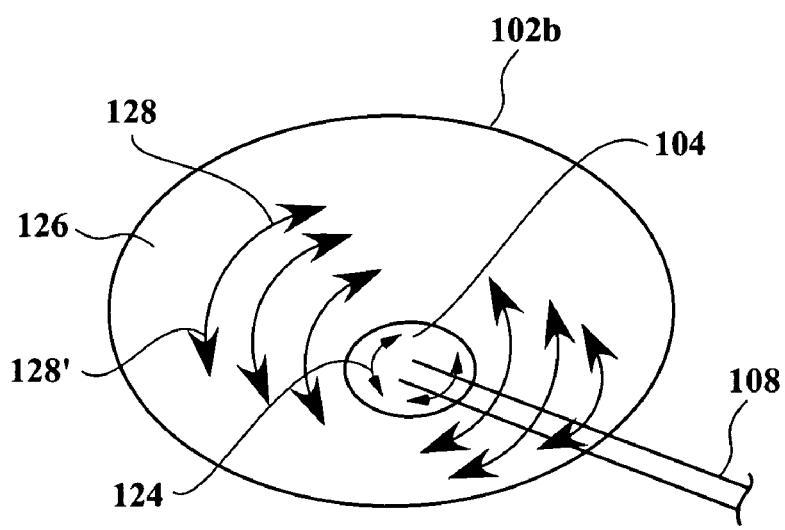
FIG. 1C is a simplified isometric view illustrating the pumping action generated over the wafer backside, in accordance with still another embodiment of the present invention.

Continuing to the simplified isometric view of FIG. 1C, the pumping action provided at the wafer backside 102b can further be understood, in accordance with one embodiment of the present invention. As can be seen, a fluid 126 is shown to cover the wafer backside 102b during the cleaning operation. In one embodiment, as the head 104 oscillates and is applied onto the wafer backside 102b with a force F, the brush 106 contacts the wafer backside 102b creating friction in the cleaning interface. In addition to such friction, the oscillatory movement of the head 104 and thus the brush 106 causes the fluid 126 covering the wafer backside 102b to move back and forth in a direction 128 and 128'. As can be seen, the fluid 126 covering the wafer backside 102b switches from moving in the direction 128 to the direction 128' that is the direction opposite to the direction 128. As can be appreciated, such back and forth movement of the fluid 126 cannot be achieved by merely rotating the brush head in one direction, as performed by the prior art. In this manner, the back and forth movement of the fluid 126 in conjunction with the mechanical application of brush 106 on the wafer backside 102b can fully dislodge particulate contaminants adhered to the wafer backside 102b.

Figure 1D:
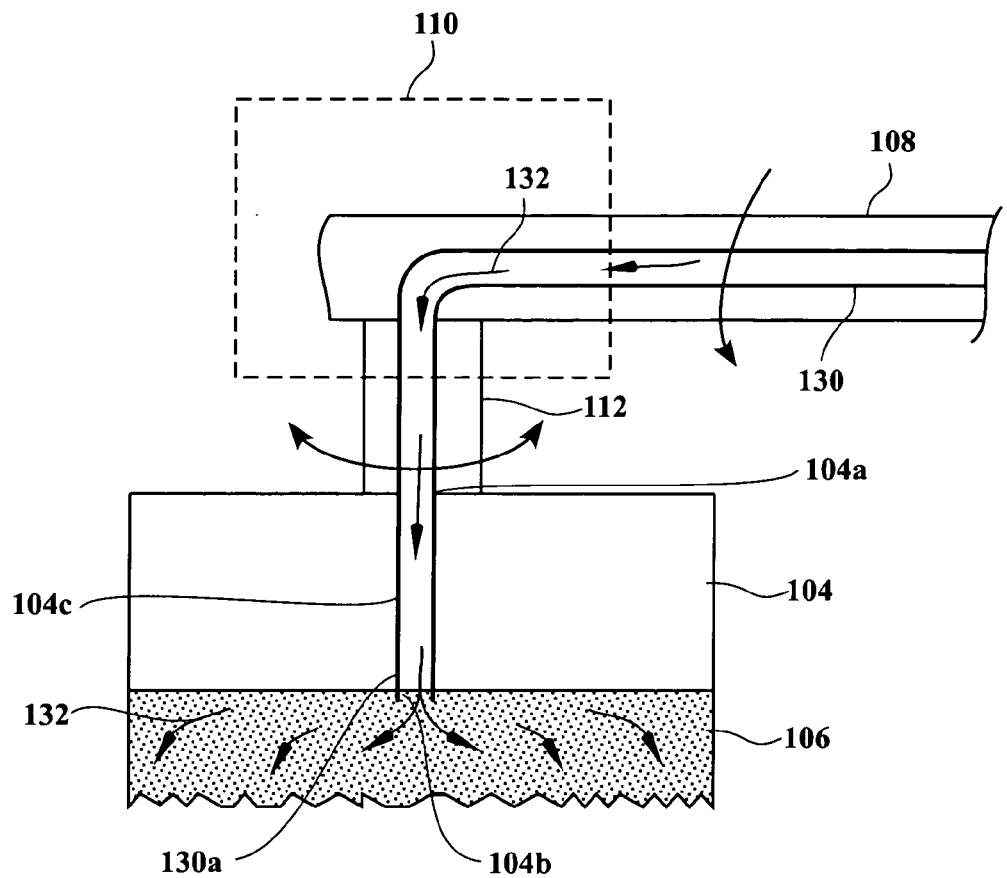
FIG. 1D is a simplified partial cross sectional view illustrating the introduction of a cleaning fluid into the brush through the head, in accordance with still another embodiment of the present invention.

Moving to a simplified partial cross sectional view shown in FIG. 1D, introduction of a cleaning fluid 132 into the brush 106 can further be understood, in accordance with one embodiment of the present invention. As can be seen, a tube 130 is fed through the arm 108, linkage 110, the connector 112, and the head 104 through an inlet 104d via the passage 104c defined substantially in a center of the head 104. The cleaning fluid 132 is introduced into the brush 106 through an outlet 104b defined in the head 104. As illustrated, the cleaning fluid 132 is depicted to flush the brush 106 as shown with arrows 132. In one embodiment, the cleaning fluid 132 can have a temperature ranging between about ambient and about 100 degrees Celsius.

In one example, during the cleaning operation, the brush 106 is applied onto the wafer backside 102b as the cleaning fluid 132 saturates the brush 106. As the head 104 oscillates and applies the brush 106 onto the wafer backside 102b with force F, the brush 106 compresses and decompresses in opposite directions. As can be appreciated, the compression and decompression of the brush 106 in opposite directions creates a pumping action believed to enhance dislodging of particulate contaminates stuck onto the wafer surface.

Although in the embodiments of the present invention the cleaning fluid is introduced into the cleaning interface through the oscillating cleaning head, in a different embodiment, the cleaning fluid can be introduced into the brush and the cleaning interface in any suitable manner (e.g., dispense nozzles attached to the arm designed to dispense fluid at the contact interface, a dispense nozzle located outside the diameter of the wafer, etc.).

Additionally, in one embodiment, the cleaning fluid 132 can be de-ionized water or any aqueous or semi-aqueous chemical solution. However, it must be appreciated by one having ordinary skill in the art that the cleaning fluid 132 can be any suitable fluid capable of cleaning surfaces of the wafer (e.g., Standard Clean 1 (SC-1), DI water, ammonia containing chemical mixtures, HF containing chemical mixtures, with surfactant being included as one of the chemical mixtures, etc.). In one implementation, the cleaning fluid 132 may be a cleaning fluid as described in U.S. Pat. No. 6,405,399, issued on Jun. 18, 2002, having inventors Jeffrey J. Farber and Julia S. Svirchevski, and entitled "METHOD AND SYSTEM OF CLEANING A WAFER AFEER CHMICAL MECHANICAL POLISHING OR PLASMA PROCESSING." This U.S. Patent, which is assigned to Lam Research Corporation, the assignee of the subject application, is incorporated herein by reference.

One of ordinary skill in the art must further appreciate that the amplitude required to remove the contaminant particulates from the wafer surface need to be sufficient to overcome the compliancy of the brush material. By way of example, the harder is the brush material, the less amplitude is required to remove the particulate contaminants whereas the softer and more compliant is the brush material, a greater amplitude and stroke length may be required to remove the particulate contaminants. According to one implementation, the mechanical oscillating assembly can oscillate in a frequency ranging between approximately 10 Hz and 10 KHz.

Figures 1, 2A:
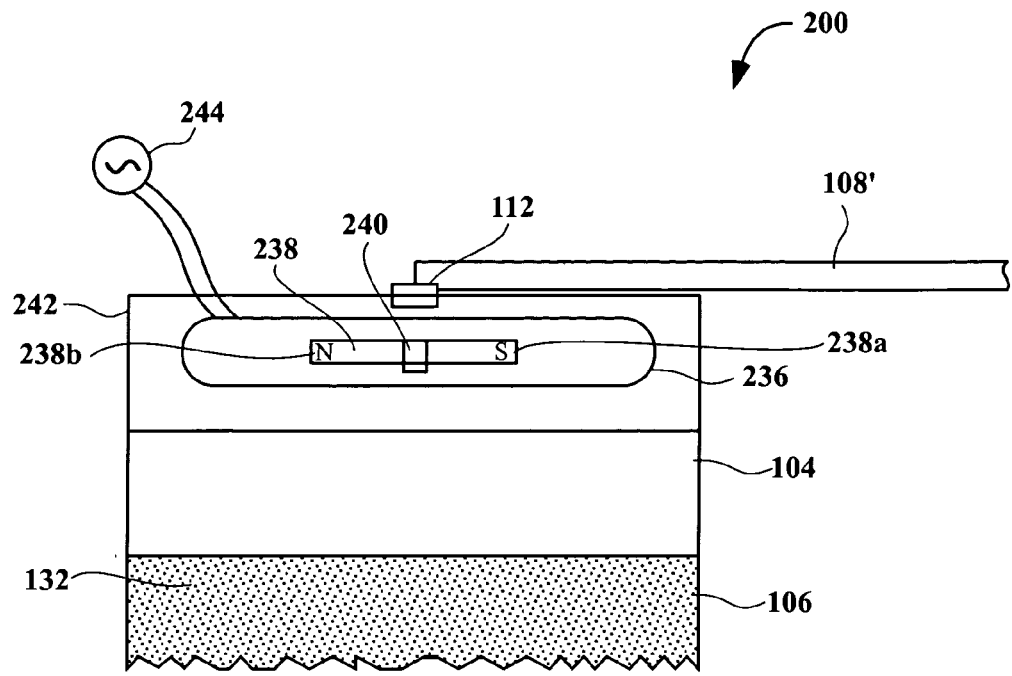
FIG. 2A-1 is a simplified cross-sectional view of a head being moved back and froth by a magnetic solenoid drive, in accordance with yet another embodiment of the present invention.

Proceeding to FIG. 2A-1, generating the oscillatory movement of the brush head 104 by using a magnetic solenoid drive head assembly 200 is depicted in a simplified cross-sectional view, in accordance with one embodiment of the present invention. As can be seen, a unit 242 is defined between the head 104 and a connector 112. A brush 106 is affixed to the head 106 on a side that is an opposite side of the unit 242. The unit 242 includes a magnet 238, a pivot 240, and a coil 236. As shown, the magnet 238 can turn about the pivot 240 and has a first field 238a and a second field 238b. The coil 236 is wrapped around the magnet 238 and is connected to alternate current (AC) 244.

Although in the embodiment shown in FIG. 2A-1 the unit 242 is defined over and outside the head 104, in a different embodiment, the unit 242 can be defined inside the head 242 or in any other suitable location so long as the function of oscillating the head 104 can be achieved. Furthermore, although in the embodiment depicted in FIG. 2A-1 the unit 242 is shown to include a permanent magnet 238, in a different embodiment, the unit 242 can include any suitable mechanism so long as the function of creating the alternating fields can be achieved (e.g., an electromagnet, etc.).

Figures 2, 2A:
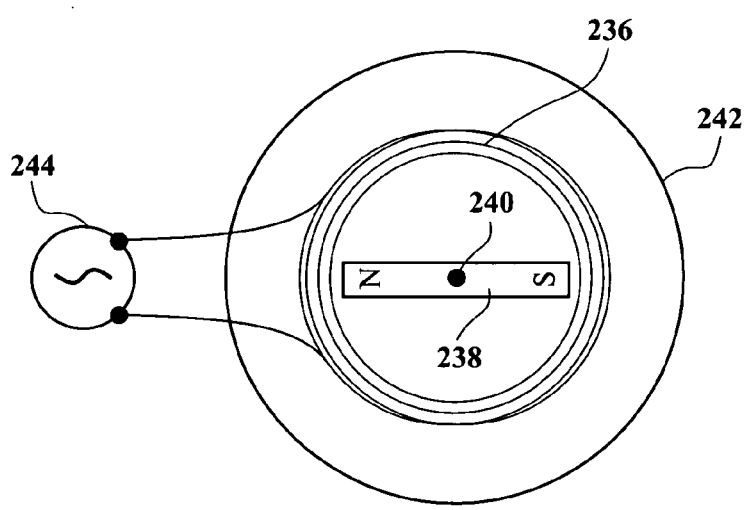

The mechanism of magnetic solenoid head can further be understood with respect to the simplified top view of the unit 242 as shown in FIG. 2A-2, in accordance with one embodiment of the present invention. In one preferred embodiment, an alternating current is run through the electrical core 236 defined around the magnet 238. In one example, the magnet 238 is defined in the middle of the unit 242 and the head 104. During one period of the AC, the head 104 moves in a first movement direction in the first half-period of AC while the head 104 moves in a second movement direction in the second half period of AC. Particularly, reversing the direction of the current results in the reversal of phases, thus causing the head 104 to move in the oscillatory movement. In one embodiment, the head 104 can oscillate backward and forward at a high frequency. According to one implementation, the magnetic solenoid head can oscillate in an ultrasonic frequency range, between approximately 10 KHz and 500 KHz.

Figures 1, 2B:
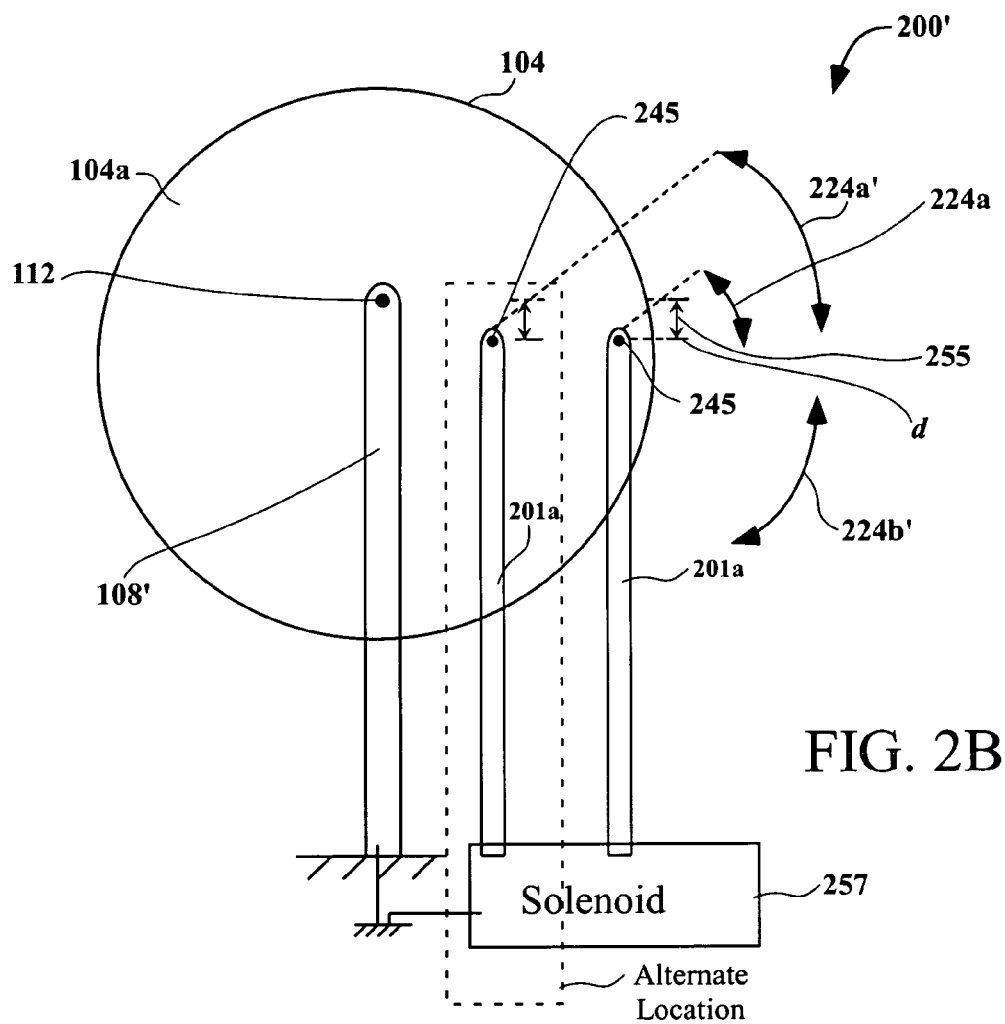
Figures 2, 2B:
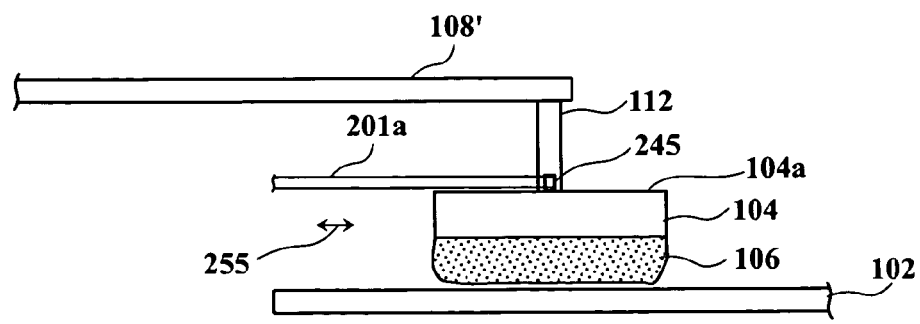

FIG. 2B-1 depicts yet another exemplary solenoid type oscillating assembly 200' in accordance with another embodiment of the present invention. As can be seen, on a first side, an arm 108' is connected to the head 104 via the connector 112 defining a center of rotation. A secondary arm 201a being rigidly connected in proximity to the periphery of the top surface 104a of the head 104 via a pin 245 on a first side. It must be noted that the pin 245 can be any appropriate connecting member appropriate to connect the secondary arm 201a and the head 104.

On a second side, the secondary arm 201' being coupled to a solenoid 257 configured to convert electrical energy to straight mechanical movement using electromagnetic force. In one example, the solenoid 257 includes a copper magnet wire winding (not shown in this Figure) that is configured to create a magnetic field. A plunger (not shown in this Figure) is drawn into the magnetic field once the coil (i.e., the winded copper magnetic wire) is energized. In this manner, the solenoid 257 provides the stroke and power needed to move the secondary arm 201a back and forth in a direction 255. As can be seen, the secondary arm 201a is connected to the arm 108' so that while the head 104 is moved across the wafer backside 102b, the solenoid oscillating assembly can make the head 104 to oscillate.

In one embodiment, as the secondary arm 201a moves upwardly in the direction 255 for a distance "d", the head 104 connected to the secondary arm 201a at point 245 rotates an arc distance 224a about the center of rotation. As can be seen, thereafter, the secondary arm 201a moves downwardly in the direction 255 causing the head 104 to rotate the arc distance 224a in the opposite direction.

In an alternate location, the secondary arm 201a is defined on top surface 104a of the head 104 at a point that is defined at the midpoint of a radius of the head 104 using the pin 245. In this embodiment, as the secondary arm 201 is moved upwardly in the direction 255 in the distance d, the head 104 is caused to move an arc distance 224a'. As can be seen, while in both embodiments the secondary arm 201a has traveled the distance d, the head 104 has moved in arc distances 224a and 224a', with the arc distance 224a' being longer than the arc distance 224a. In one implementation, when the secondary arm 201a is secured to the top surface 104a of the head at a point that is defined closer to the center of rotation (e.g., the connector 112), the longer the arc distance traveled by the head 104 will be.

While still defined at the midpoint of the head radius, the secondary arm 201a can be moved downwardly in the direction 255 causing the head 104 to rotate an arc distance 224b'. In one example, the arc distance 224a' can be equivalent to the art distance 224b'. Thus, as the secondary arm 201a is moved in the direction 255, the movement of the secondary arm 201a causes the head 104 to move in an oscillatory motion in distances of 224a and 224b. As such, fluid defined at the interfacing area as well as at the periphery of the head cannot be expelled to the other areas of the wafer surface or around the chamber, improving the efficiency as well as reliability of the cleaning operation. Furthermore, in this manner, in one example, the mechanical energy needed to remove a particle contaminant having a size in the order of submicrons from the wafer surface requires a few microns of differential motion between the brush and the particulate contaminant.

FIG. 2B-2 is a simplified cross sectional view of the solenoid type head assembly shown in FIG. 2B-1, in accordance with one embodiment of the present invention. As can be seen, the arm 108' is secured to the top surface 104a of the head 104 via the connector 112 while the secondary arm 201a is secured to the top surface 104a of the head 104 via the pin 245. In this manner, fluid used to clean the wafer surface defined at the interfacing area is substantially confined.

Figures 1, 3A:
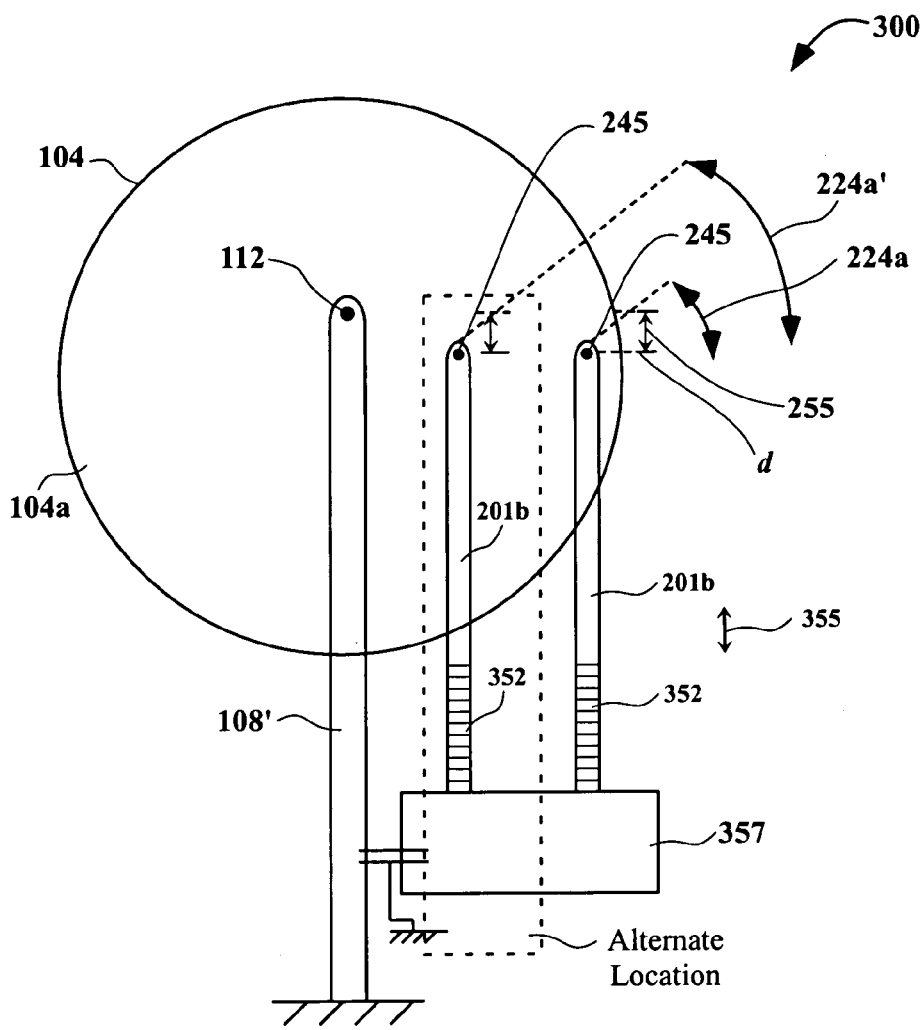
Figures 2, 3A:
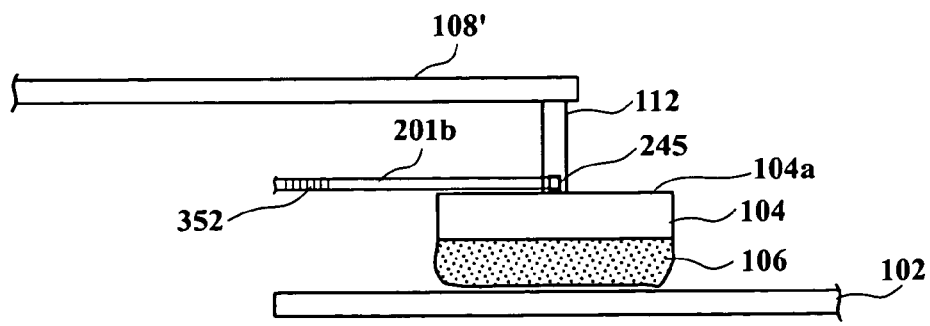

FIG. 3A-1 and 3A-2 depict an exemplary megasonic transducer oscillating assembly 300, in accordance with one embodiment of the present invention. As can be seen, the arm 108' is connected to the center of the brush head 104 via a connector 112, defining the center of rotation of the head 104. On the first side, a secondary arm 201b is shown to be secured rigidly to the top surface 104a of the head 104 via the pin 245. On the second side, the secondary arm 201b is shown to have been connected to a plurality of piezoelectric crystals 352 defined between the second side of the secondary arm 201b and a stationary component 357 configured to provide electrical energy to the piezoelectric crystals 352 along a direction 355. It must be noted that the piezoelectric crystals 352 can be connected to the secondary arm 201b with any appropriate techniques. Still further, the piezoelectric crystals 252 are designed to be bonded to a resonator (not shown), creating a megasonic transducer. As can be seen, the secondary arm 201b is connected to the arm 108' so that while the head 104 is moved across the wafer backside 102b, the head 104 can be made to oscillate.

Considering first the initial location wherein the secondary arm 201b is secured to the top surface 104a via the pin 245 defined in close proximity to the periphery of the top surface 104a. In such embodiment, as electrical energy is applied, the piezoelectric crystals 352 start expanding energy along the direction 355. As a consequence, the secondary arm 201b is moved upwardly in the direction 255 for a distance d while the head 104 is shown to have traveled the arc distance 224a.

Considering an alternate location wherein the secondary arm 201b is secured to the top surface 104a via the pin 245 at a position defined at the midpoint of the radius of the head 104. In such embodiment, as a result of the expansion of the piezoelectric crystals 352 in the direction 355, the secondary arm 201b travels upwardly in the direction 355 for a distance d. However, as can be seen, the head 104 is shown to have traveled the arc distance 224a'.

In the latter embodiment, once the piezoelectric crystals 352 compress and return to the respective initial positions, the head 104 rotates about the point of rotation in the arc distance 224a', but in the opposite direction. In this manner, the head 104 is oscillated forward and backward in the arc distance 224a, thus preventing the expelling of fluid droplets (e.g., flinging of fluid droplets) onto the surface of the wafer defined outside the head 104 and around the chamber.

As can be seen, the arc distance 224a' is longer than the arc distance 224a. Thus, in one example, the arc distance traveled by the head 104 or the stroke length (e.g., distance traveled by the secondary arm 201b) can be changed by moving the pin connecting the secondary arm 201a to the head 104 with respect to the center of rotation of the head. That is, depending on the pin being defined closer to the edge of the top surface of the head as opposed to the center of rotation, the amplitude of rotation can vary. Specifically, in one example, the closer to the center of rotation the pin is defined, the larger the amplitude and arc sweep of oscillation can be.

Referring to FIG. 3A-2, a simplified cross sectional view of the megasonic oscillating assembly of the present invention is depicted, in accordance with one embodiment of the present invention. As can be seen, the while the arm 108' is secured to the top surface 104a of the head 104 via the connector 112, the secondary arm 201b is secured to the top surface 104a of the head 104 via the pin 245. In this manner, the oscillatory movement of the head 104 and thus the pumping action generated by the oscillating movement of the head 104 can be modified by changing the position of the pin 245 with respect to the center of rotation.

In one example, the amplitude of the brush stroke (i.e., arc distance) can be determined by the compliancy of the brush and the thickness of the brush material. For instance, the less compliant the brush is, the less the amplitude of the stroke can be whereas the more compliant the brush is, the longer the amplitude of the brush stroke can be. In the latter scenario, the thicker the thickness of the brush material is, the less the amplitude of the brush stroke can be.

Figures 1, 3B:
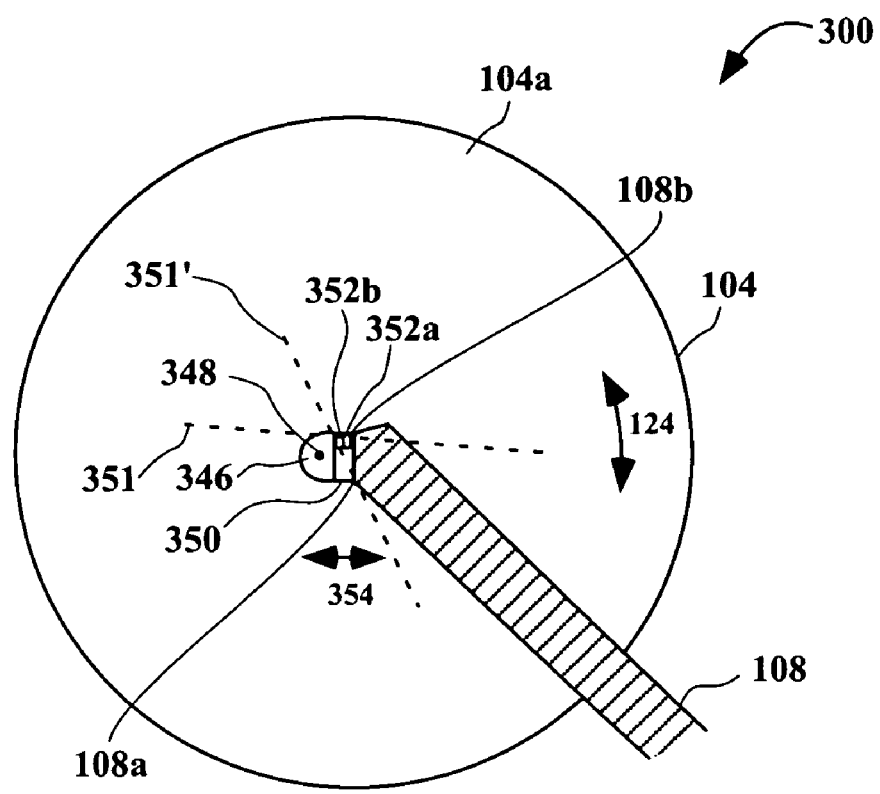
Figures 2, 3B:
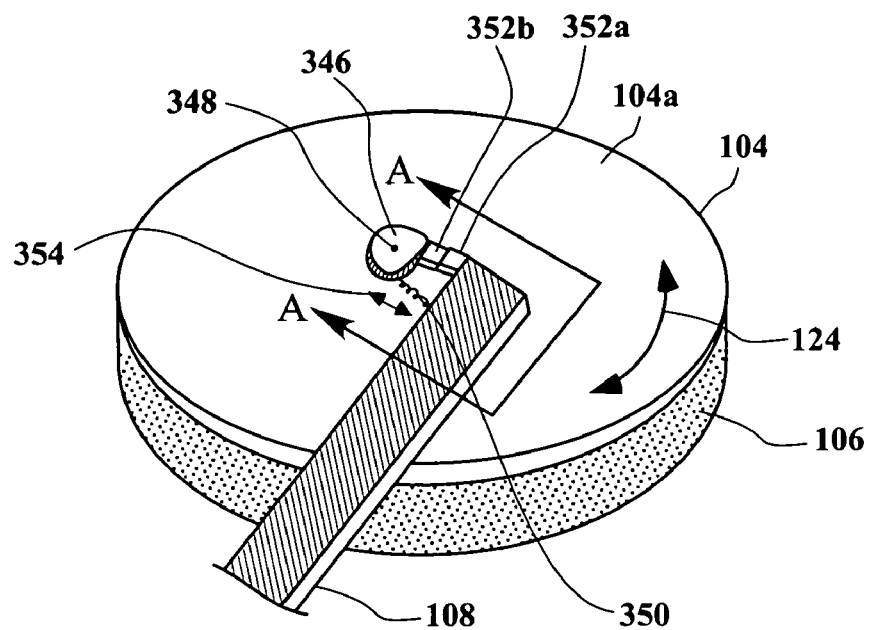
Figures 3, 3B:
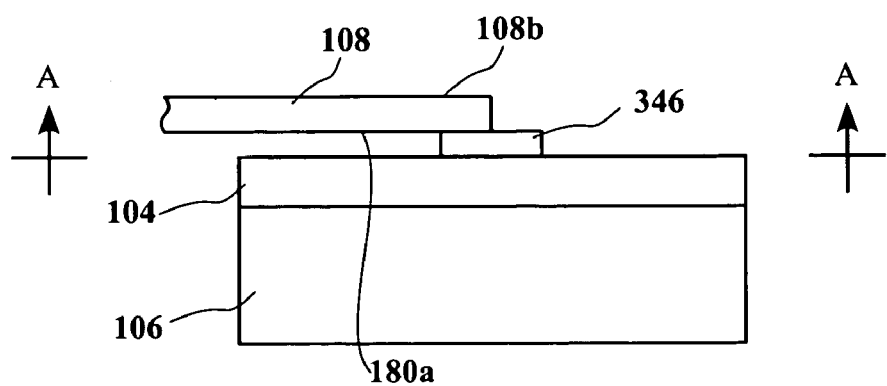

Proceeding to FIG. 3B-1 through 3B-3, still another exemplary megasonic oscillating assembly 300' can further be understood, in accordance with one embodiment of the present invention. FIG. 3B-1 is a simplified top view of an exemplary megasonic head assembly 300', in accordance with one embodiment of the present invention. As shown, the megasonic head assembly 300' includes the arm 108, the brush head 104, and a fixed member 346 connected to the top surface 104a of the head 104. According to one exemplary embodiment, the fixed member 346 is secured to the top surface 104a of the head 104 using a fastening member 348. It must be appreciated by those of ordinary skilled in the art that the fixed member 346 can be connected to the top surface 104a using any appropriate techniques.

The fixed member 346 is shown to be connected to a lower edge 108a of the arm 108 using a flexible member 354. As shown, piezoelectric crystals 352a and 352b are defined between an upper edge 108b of the arm 108 and the fixed member 346. The piezoelectric crystals 352a and 352b are bonded to a resonator (not shown), creating a megasonic transducer. In the embodiment shown in FIG. 3B-1, the piezoelectric crystals 352a, and 352b are connected to the arm 108 with appropriate techniques.

According to one embodiment, as electrical energy is applied, the piezoelectric crystals 352a and 353b start expanding energy along an axis 351. The energy imparted by the piezoelectric crystals 352a and 352b causes the arm 108 connected to the flexible member 350 to move. Consequently, the arm 108 is moved causing the flexible member 350 to contract in a direction 354. The flexion of the flexible member 350 then causes the head 104 to move backward and forward in the oscillation direction 124.

FIG. 3B-2 shows a simplified, partial, isometric view of an exemplary megasonic head assembly, in accordance with one embodiment of the present invention. In the exemplary embodiment shown in FIG. 3B-2, the flexible member 350 is illustrated to be made of a material having spring-like characteristics. In this manner, while piezoelectric crystals 352a and 352 are powered and are imparting energy, the imparted energy can ultimately cause the flexible member 350 to contract. As a result, the head 104 is caused to start oscillating in the direction 124.

FIG. 3B-3 is a simplified cross-sectional view A—A shown in FIG. 3B-2, in accordance with one embodiment of the present invention. As can be seen, while the fixed member 356 is secured to the top surface 104a of the head 104, the arm 108 is not in contact with the top surface 104a of the head 104. Rather, the arm is in contact with the top surface 104a of the head 104 via the flexible member 350, which in turn, is secured to the fixed member 346. In this manner, the energy imparted by the piezoelectric crystals 352a and 352 to the arm 108 can easily be transferred to the head 104 as a result of the movement of the arm 108.

It must be noted that the embodiments of the present invention can include one or a stack (i.e., a plurality) of piezoelectric crystals. In one embodiment, for instance, each piezoelectric crystal may provide a movement frequency between about 50 micro Hertz and 60 micro Hertz. Thus, the stack of piezoelectric crystals including a plurality of piezoelectric crystals can provide the movement frequency in microns. In one implementation, the megasonic frequency can range between approximately about 0.4 MHz and about 500 MHz. In one example, the ultrasonic frequency can range between approximately about 10 KHz and about 500 KHz. In one embodiment, the number of piezoelectric crystals may be limited as the piezoelectric crystals may start resonating against each other.

One of ordinary skill in the art must appreciate that although in one embodiment of the present invention the flexible member 350 can to be a spring, in a different embodiment, the flexible member 350 of the present invention can be any component constructed from any material capable of flexing (e.g., copper, berlins, appropriate durometer polymeric material, etc.). Furthermore, it must be noted that the megasonic head assembly of the present invention can be operated by any appropriate system, method, or mechanics known by the person of ordinary skill in the art so long as the brush head can be caused to oscillate backward and forward thus preventing the fluid migration and expelling of fluid droplets on the wafer surface as well as around the chamber.

It must further be appreciated that the piezoelectric crystals can be made of any appropriate piezoelectric material (e.g., piezoelectric ceramic, lead zirconium tintanate, piezoelectric quartz, gallium phosphate, etc.). In a like manner, the resonators can be made of any appropriate material (e.g., ceramic, silicon carbide, stainless steel, aluminum, quartz, etc.). Additionally, one having ordinary skill in the art must appreciate that a thickness of the piezoelectric crystals depends on the design of the crystals, mechanical strength of the crystal material, and type of crystal material. In one example, the thickness of the piezoelectric crystals is configured to range between approximately about 1 mm and about 6 millimeter, and a more preferred range of approximately about 2 mm and 4 mm and most preferably between approximately about 1 mm to approximately about 2 millimeters. In one embodiment, wherein the crystals are ceramic type crystals, the thickness of the crystals is configured to range between approximately about 1 to about 4 millimeters.

In one embodiment, when oscillating at ultrasonic or megasonic frequencies, additional energies may be introduced in addition to the mechanical energy. That is, by operating a transducer having a plurality of piezoelectric crystals defined thereon acoustic streaming to the fluid may be introduced as a second-order effect from the megasonic oscillation frequencies achieved by the brush and hence to the substrate surface.

By way of example, it is believed that implementing the ultrasonic and megasonic energy to oscillate the head may introduce an additional energy that can extend beyond the mechanical energy almost without damaging the wafer surfaces. By way of example, once the particulate contaminants are dislodged as a result of forward and backward movements of the brush, the particulate contaminants are moved back and forth until the particulate contaminants are finally removed and flushed out. In one embodiment, a shear profile may be generated. For instance, the shear profile movement may not be pronounced at the interface of the brush and the wafer surface. However, the shear profile movement can be more pronounced at the periphery layer of the head where the interface between the brush and the wafer surface has been crossed. In one instance, the shear profile can change direction and switch back and forth outside the interface area.

Figure 4A:
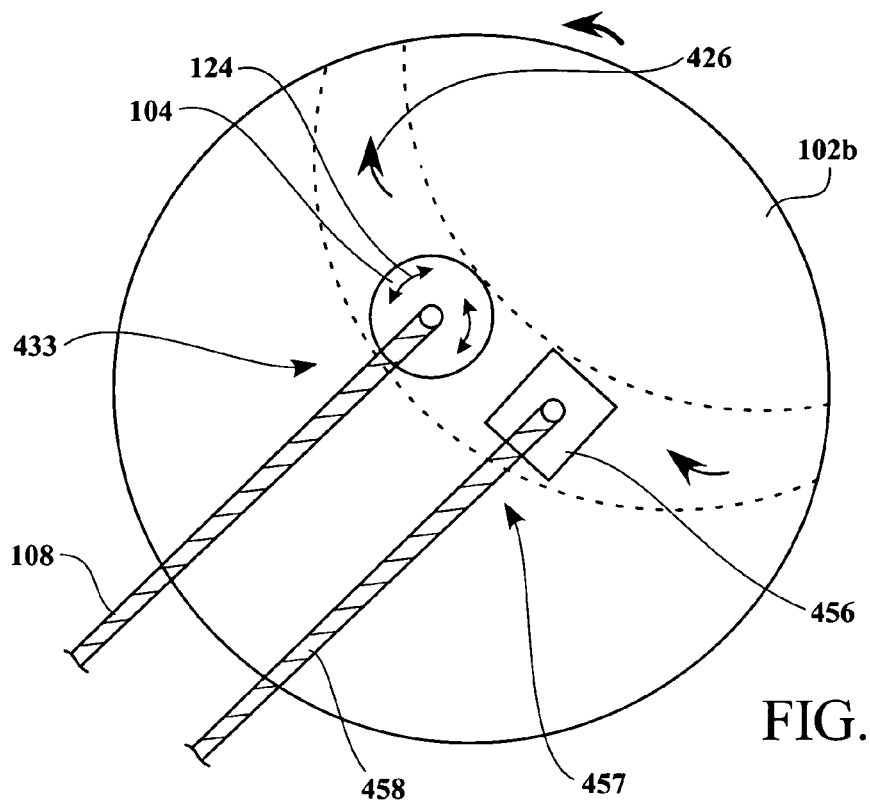
FIG. 4A is a simplified cross sectional view of a wafer processing system including an oscillating brush cleaning assembly and a proximity assembly, in accordance with still another embodiment of the present invention.
Figure 4B:
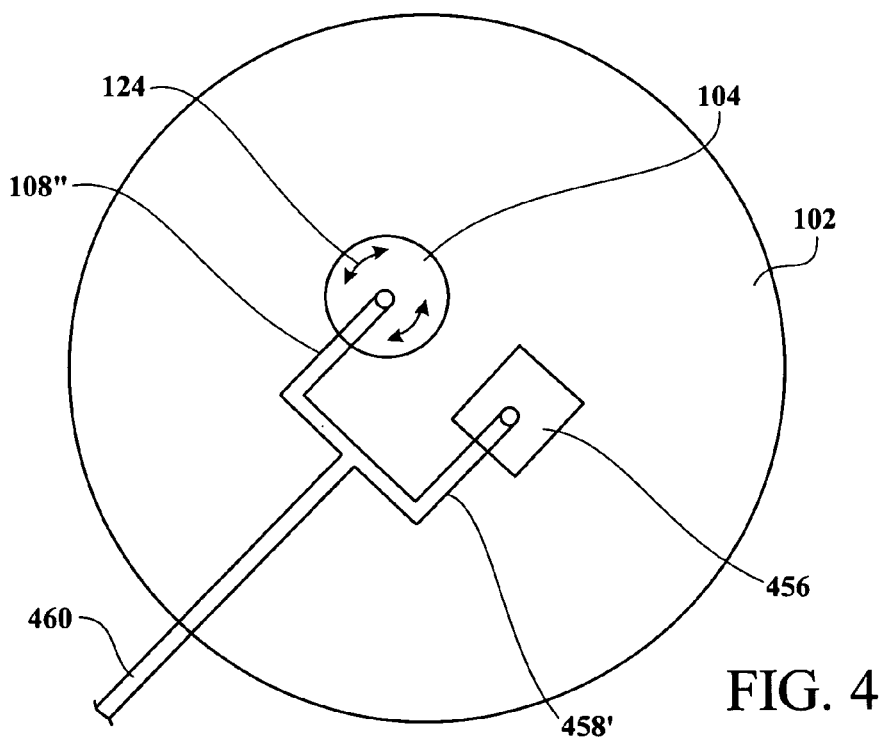
FIG. 4B is a simplified top view of a wafer processing system implementing one arm to move the head and the proximity head, in accordance with still another embodiment of the present invention.

Continuing to FIGS. 4A–4B, an exemplary wafer processor including an oscillating brush cleaning assembly 433 and a proximity assembly 457 is shown, in accordance with one embodiment of the present invention. As can be seen in the simplified top view of FIG. 4A, the oscillating brush cleaning assembly 433 includes an arm 108″ secured to a head 104 while the proximity assembly 457 includes a proximity arm 458 connected to a proximity head 456. As can be seen, the head 104 and the proximity head 456 are defined substantially adjacent to one another and are configured to follow the same path. In the embodiment shown in FIG. 4A, the head 104, and the proximity head 456 are configured to be applied onto the wafer backside 102b along a path 426. As can be seen, the proximity head 456 follows the head within the path 426.

According to one example, as the head 104 oscillates in the direction 124 along the path 426 and dislodges particulate contaminants on the wafer backside 102b, the proximity head 456 supplies a second fluid (e.g., isopropyl alcohol (IPA), DIW, etc.) to generate a wafer processing meniscuses in contact with the wafer backside 102b and uses a vacuum to remove fluids from the wafer backside 102b. For instance, the proximity head 456 can apply the vacuum in close proximity to the wafer backside 102b to suck out the IPA vapor, the DIW, or any fluids that may be on the wafer backside 102b at substantially the same time the IPA and DIW is supplied to the wafer backside 102b. In one embodiment, the portion of the second fluid that is in the region between the proximity head 456 and the wafer backside 102b is herein referred to as the meniscus. In this manner, fluids can be removed from the region between the wafer backside 102b and the proximity head 456 while a different fluid is being introduced to the region between the wafer backside 102b and the proximity head 456. In this manner, the wafer backside 102a can be cleaned and dried substantially at the same time.

In a different embodiment, the head 104 and the proximity head 456 can be applied onto the wafer backside 102 using a single arm 460. As can be seen, the arm 460 is connected to the arm 108″ connected to the head 104 and a proximity arm 458′ connected to the proximity head 456, as shown in the simplified top view diagram shown in FIG. 4B, in accordance with one embodiment of the present invention. In the illustrated embodiment, the proximity head 456 and the head 104 can be applied onto the wafer backside 102b in any direction so as to clean and dry the wafer backside 102b. It should be appreciated that any other suitable configuration that would enable the movement of the proximity head 456 in close proximity to the wafer backside 102b may be utilized.

In one exemplary embodiment, the proximity head can be the proximity head as described in the U.S. patent application Ser. No. 10/261,839, filed on Sep. 30, 2002, having inventors John M. de Larios, Mike Ravkin, Carl Woods, Fritz Redeker, and James P. Garcia, and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES." This U.S. Patent Application, which is assigned to Lam Research Corporation, the assignee of the subject application, is incorporated herein by reference.

Figure 5:
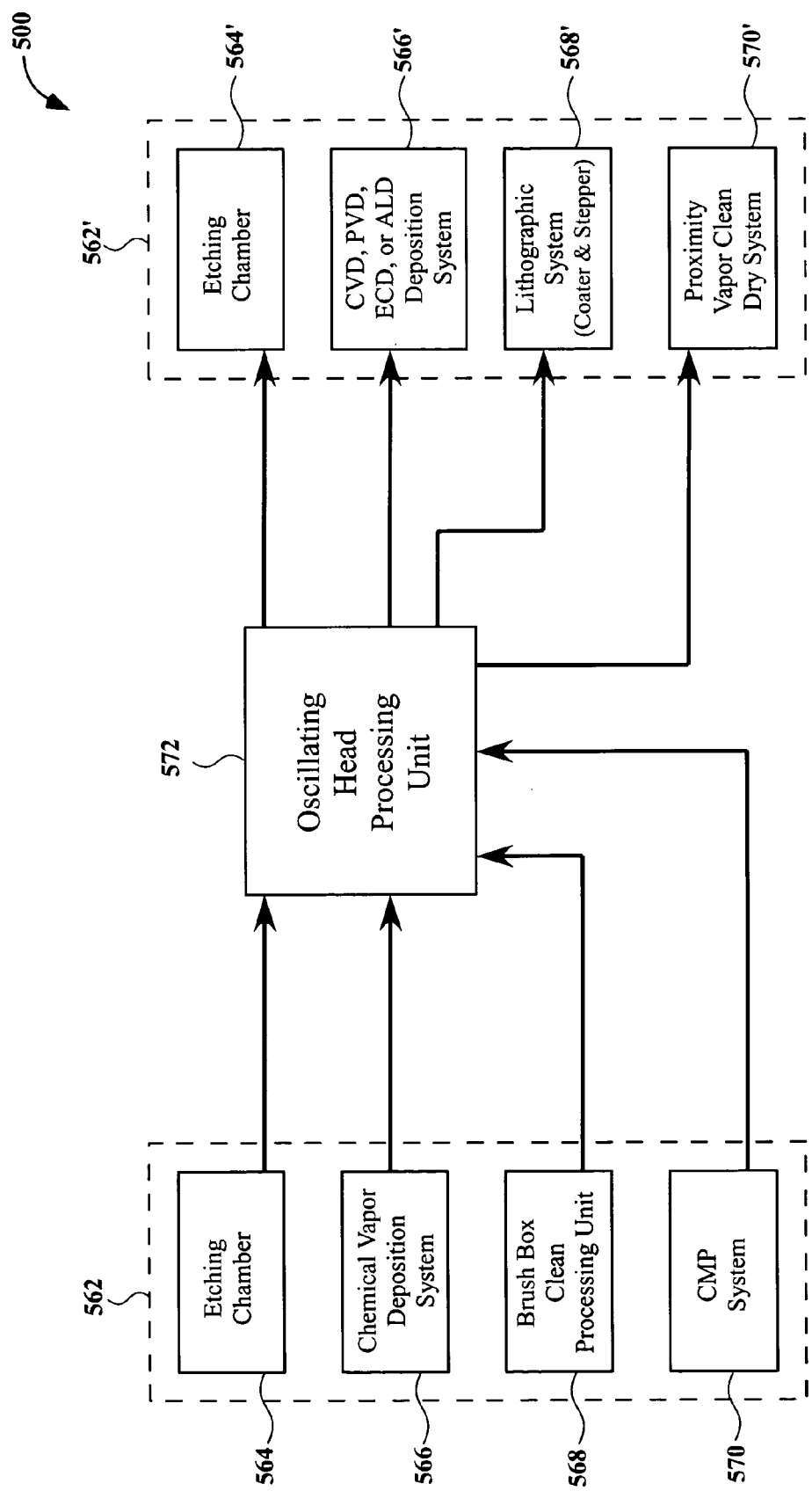
FIG. 5 is a simplified block diagram of a clustered wafer processing system including an oscillating head processing unit, in accordance with still another embodiment of the present invention.

Reference is made to a clustered wafer processing system 500 shown in FIG. 5, in accordance with one embodiment of the present invention. After a wafer front side and/or backside has been processed by any of the units defined in a first wafer processing box 562 (i.e., pre-processing system), the wafer backside and/or front side can be cleaned in an oscillating head processing unit 572 of the present invention. Thereafter, the wafer backside and/or front side can be processed by any of the units defined in a second processing box 562′ (i.e., post processing system).

As can be seen, the first processing box 562 includes an etching chamber 564, a chemical vapor deposition system 566, a brush box clean processing unit 568, and a chemical mechanical polishing (CMP) system 570. The first processing box 562 can also include electrochemical deposition module, rapid thermal processing module, lithographic processing module, etc. In a like manner, the second processing box includes an etching chamber 564′, a chemical vapor deposition (CVD) system, physical vapor deposition (PVD) system, electrochemical deposition (ECD) system, or an atomic layer deposition (ALD) system 566′, a lithographic processing system (including coater and stepper) module 568′, and a proximity vapor clean dry system 570′.

It must be appreciated that a wafer processing cycle performed by the clustered wafer processing system 500 can include any combination of the units in the first processing box 562 and the units in the second processing box 562′. For instance, one processing cycle can include processing the wafer in the etching chamber 562 followed by cleaning the wafer in the oscillating head processing unit 572, which in turn, is followed by processing the wafer in a lithographic processing system, such as a coater and stepper 568′. In a different embodiment, after the wafer is cleaned in the brush box clean processing unit 568, the wafer can be cleaned in the oscillating head processing unit 572 followed by processing the wafer in chemical vapor deposition system 566′. Of course, one of ordinary skill in the art should note that the examples are not meant to limit the application of the oscillating head processing unit 572 of the present invention.

One of ordinary skill in the art should further note that the first processing box 562 and the second processing box 562′ can include additional apparatuses, systems, and modules capable of providing different substrate preparation operations (e.g., spin, rinse, and dry module, proximity vapor process module, rapid thermal processing systems, etch systems, etc.).

In one exemplary embodiment, the proximity vapor clean and dry system can be the system as described in the U.S. Pat. No. 6,488,040, issued on Dec. 3, 2002, having inventors John M. de Larios, Mike Ravkin, Glen Travis, Jim Keller, and Wilbur Krusell, and entitled "CAPILLARY PROXIMITY HEADS FOR SINGLE WAFER CLEANING AND DRYING." This U.S. Patent Application, which is assigned to Lam Research Corporation, the assignee of the subject application, is incorporated herein by reference. Furthermore, in one exemplary embodiment, the proximity head can be the proximity head as described in the U.S. Pat. No. 6,616,772, issued on Sep. 9, 2003, having inventors John M. de Larios, Mike Ravkin, Glen Travis, Jim Keller, and Wilbur Krusell, and entitled "METHODS FOR WAFER PROXIMITY CLEANING AND DRYING." This U.S. Patent Application, which is assigned to Lam Research Corporation, the assignee of the subject application, is incorporated herein by reference.

Figure 6A:
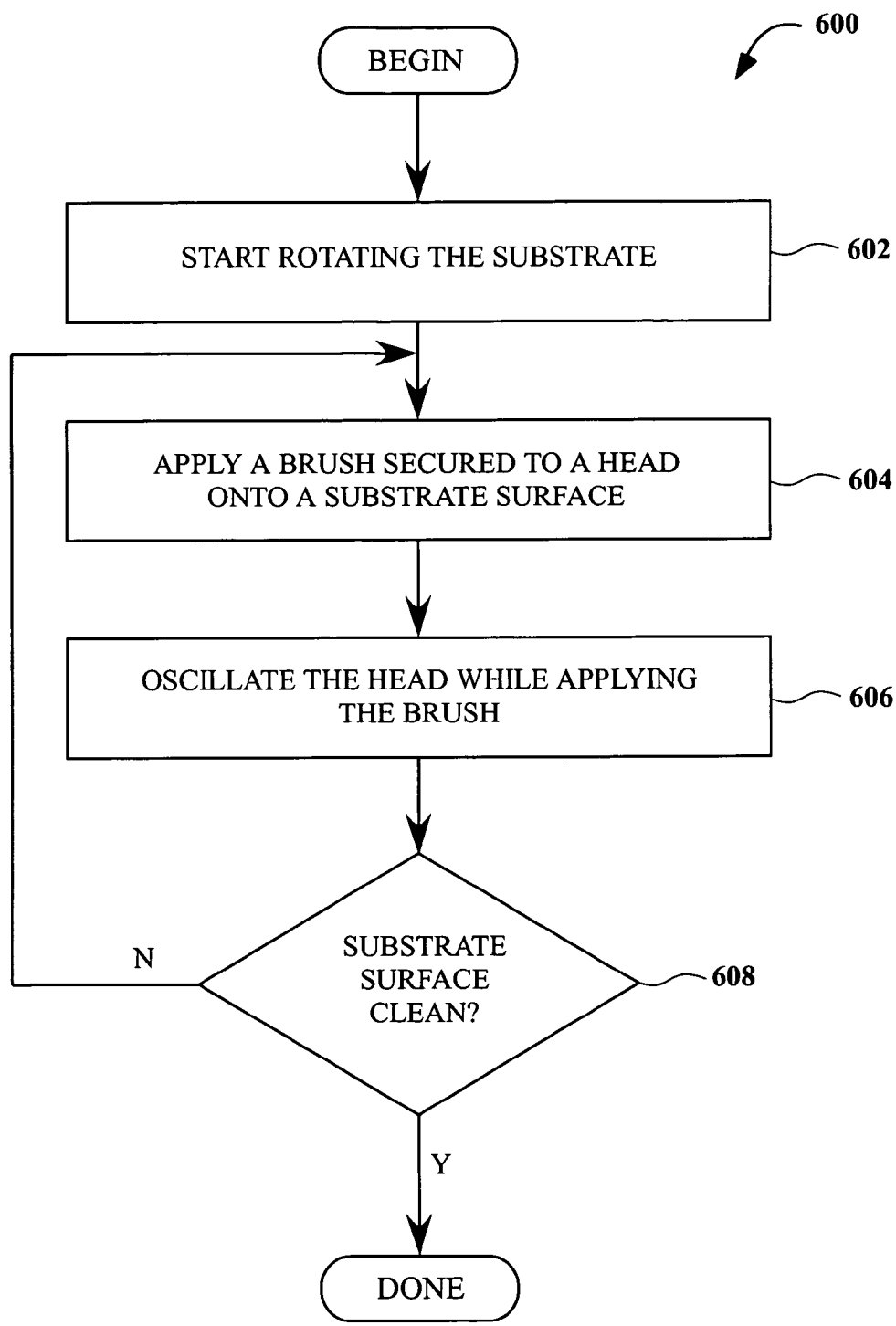
FIG. 6A is a flowchart diagram of method operations performed by an exemplary scrubbing module, in accordance with still another embodiment of the present invention.

Reference is made to a flowchart 600 of FIG. 6A depicting method operations performed in an exemplary brush cleaning module, in accordance with one embodiment of the present invention. The method begins in operation 602 in which rotating the substrate is started followed by operation 604 in which a brush secured to a head is applied onto a substrate surface. In one example, the backside of the substrate can be cleaned using the brush cleaning module of the present invention. Next, the method continues to operation 606 in which the head is oscillated while the brush is being applied onto the substrate surface.

Moving to operation 608, a determination is made as to whether the surface of the substrate is cleaned. If substrate surface has not been cleaned, the method continues to operation 604. In this manner, expelling of fluid droplets onto the substrate surface defined outside of the head as well as fluid migration can be prevented thus improving the cleaning operation.

Figure 6B:
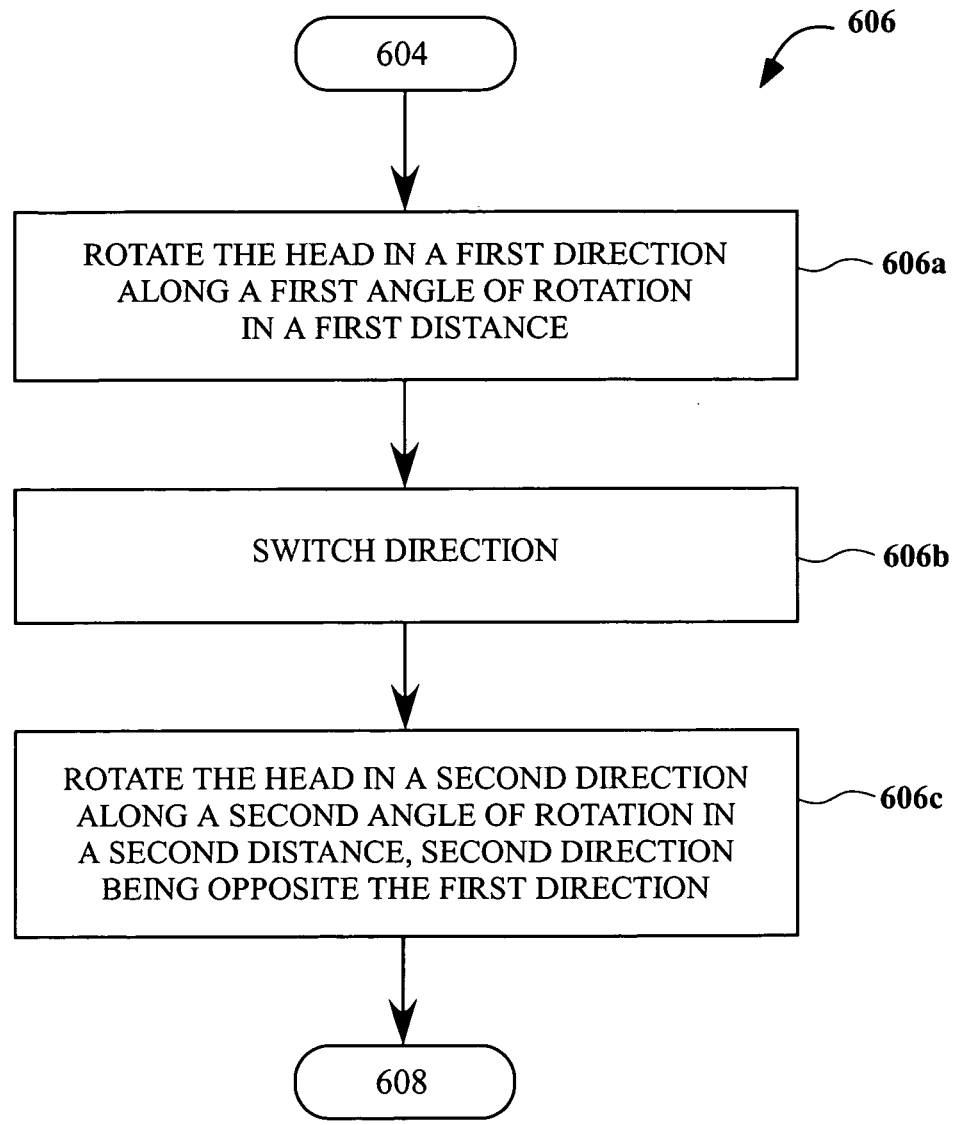
FIG. 6B is a flowchart diagram of method operations performed in oscillating the head, in accordance with one embodiment of the present invention.

FIG. 6B depicts method operations performed in operation 606, according to one embodiment of the present invention. In operation 606a, the head is rotated in a first direction along a first angle of rotation in a first distance. In one embodiment, the first angle of rotation can be between about 0 degrees to 90 degrees. Moving to operation 606b, the direction in which the head is being rotated is switched. In the subsequent operation, operation 66c, the head is rotated in a second direction along a second angle of rotation in second distance. The second angle of rotation is opposite the first angle of rotation.

Figure 7:
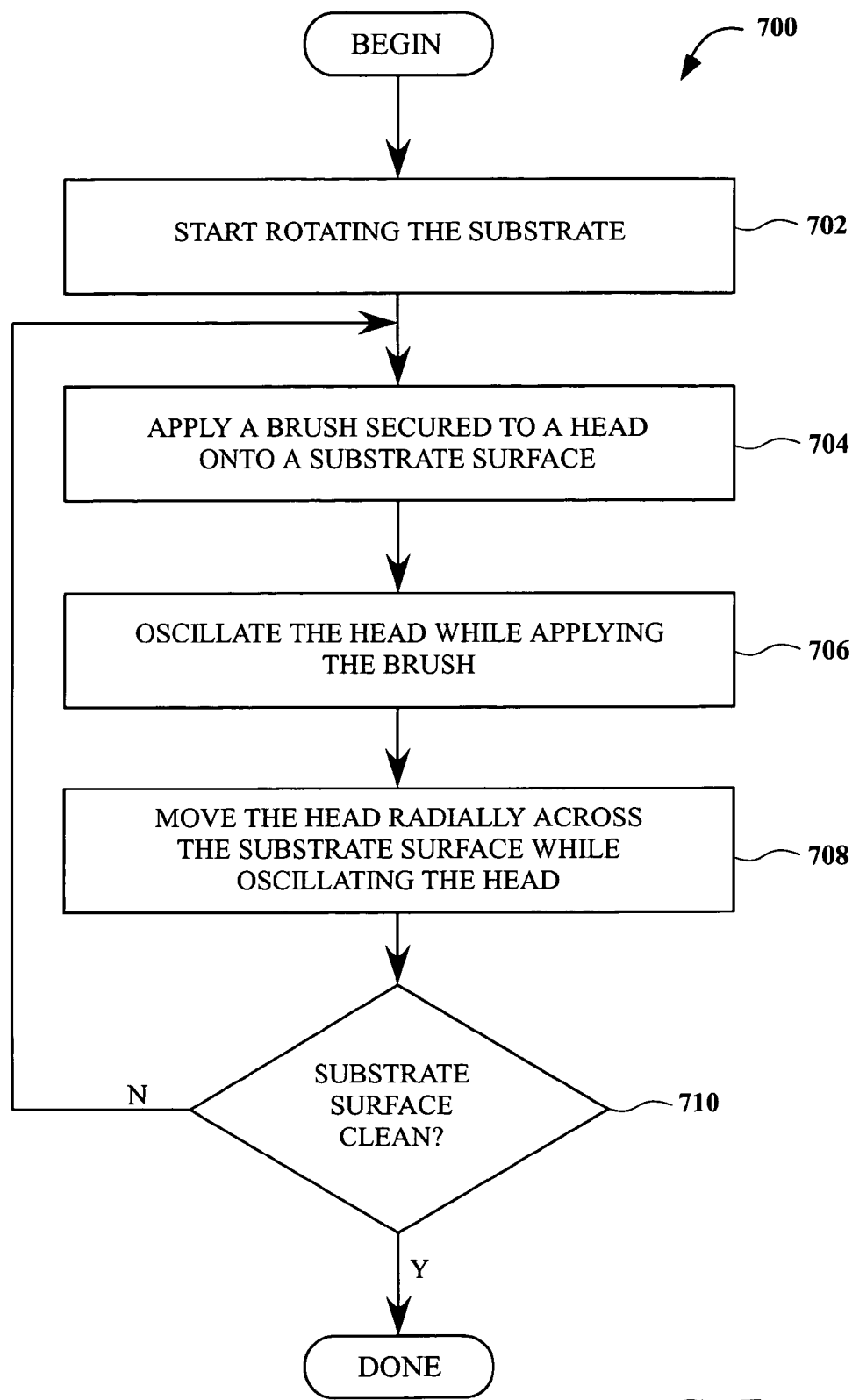
FIG. 7 is a flowchart diagram of method operations performed by yet another exemplary scrubbing module, in accordance with still another embodiment of the present invention.

Reference is made to flowchart 700 of FIG. 7 depicting method operations performed in yet another exemplary brush cleaning module, in accordance with one embodiment of the present invention. The method begins in operation 602 in which rotation of the substrate is started followed by operation 704 in which a brush secured to a head is applied onto a substrate surface. Next, the method continues to operation 706 in which the head is oscillated while the brush is being applied onto the wafer surface. Proceeding to operation 606, the head is moved radially across the substrate surface while oscillating the head.

Although the foregoing invention has been described in some detail for purposes of clarity of understanding, it will be apparent that certain changes and modifications may be practiced within the scope of the appended claims. For example, the embodiments of the present invention can be implemented to clean any substrate having varying sizes and shapes such as those employed in the manufacture of semiconductor devices, flat panel displays, hard drive discs, flat panel displays, and the like. Additionally, the present embodiments are to be considered as illustrative and not restrictive, and the invention is not to be limited to the details given herein, but may be modified within the scope and equivalents of the appended claims.

What is claimed is:

1. An apparatus for brushing a surface of a substrate, comprising:
   a brush for scrubbing the surface of the substrate;
   a head for holding the brush; and
   an arm for holding the head about a connection point, the arm being connected to an oscillating mechanism for causing the head to oscillate rotationally at an angle of rotation about the connection point.

2. An apparatus of claim 1, wherein the oscillating mechanism includes one of a mechanical drive mechanism, a solenoid drive, and a megasonic transducer.

3. An apparatus of claim 1, wherein the arm is configured to move across the surface of the substrate.

4. An apparatus of claim 1, wherein the oscillating mechanism is configured to oscillate the head at a set frequency.

5. An apparatus of claim 1, wherein the oscillating mechanism is configured to oscillate the head up to about 500 MHz.

6. An apparatus of claim 1, wherein the angle of rotation traverses forward and backward about the connection point, and the traverse in the forward and the backward completes a cycle of the oscillation of the head.

7. An apparatus of claim 1, wherein when the brush is applied onto the surface of the substrate while the head is oscillating, an alternating pressure field is created between the brush and the surface of the substrate.

8. An apparatus of claim 7, wherein the alternating pressure field results in a local mass transport of fluid defined on the surface of the substrate under the brush.

9. An apparatus of claim 1, wherein a back and forth movement of the fluid enables dislodging of particulate contaminants that may adhered onto the surface of the substrate.

10. An apparatus of claim 1, wherein a cleaning fluid is introduced into the cleaning interface through the brush.

11. An apparatus of claim 1, wherein a compression and decompression of the brush being applied onto the surface of the substrate in opposite directions generates local mass transport of fluid on the wafer surface under the brush.

12. An apparatus of claim 1, wherein the apparatus is a part of a clustered wafer processing architecture.

13. An apparatus for brushing a surface of a substrate, comprising:
   a brush for scrubbing the surface of the substrate, the brush configured to compress and decompress;
   a head for holding the brush; and
   an arm for holding the head about a connection point, the arm being connected to an oscillating mechanism for causing the head to oscillate rotationally about an angle of rotation about the connection point, wherein an oscillation of the head about the angle of rotation about the connection point is configured to compress and decompress the brush as the brush is being applied onto the surface of the substrate.

14. An apparatus as defined in claim 13, wherein the oscillating mechanism includes one of a mechanical drive mechanism, a solenoid drive, and a megasonic transducer.

15. A brush system for scrubbing a surface of a wafer, comprising:
   a flat brush to be applied to the surface of the wafer;
   a head for holding the flat brush;
   an arm for holding the flat brush at a center point of the head; and
   an oscillating assembly having a secondary arm, the secondary arm being connected to the head at a location other than the center point of the head, the oscillating assembly being configured to impart an oscillating frequency to the secondary arm so as to cause the head and flat brush to oscillate when the flat brush is applied to the surface of the wafer.

16. A brush system for scrubbing a surface of a wafer as recited in claim 15, wherein the oscillating assembly includes a solenoid drive for imparting the oscillating frequency to the secondary arm.

17. A brush system for scrubbing a surface of a wafer as recited in claim 15, wherein the oscillating assembly includes at least one piezoelectric transducer for imparting the oscillating frequency to the secondary arm.

* * * * *